United States Patent
Merten et al.

(10) Patent No.: US 9,811,361 B2
(45) Date of Patent: Nov. 7, 2017

(54) FLEXIBLE ALLOCATION OF I/O CHANNELS OF A HARDWARE COMPONENT

(71) Applicant: dSPACE digital signal processing and control engineering GmbH, Paderborn (DE)

(72) Inventors: Stefan Merten, Bielefeld (DE); Marc Schlenger, Paderborn (DE); Holger Ross, Muenster-Hiltrup (DE); Frank Mertens, Bad Lippspringe (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 1003 days.

(21) Appl. No.: 14/055,497

(22) Filed: Oct. 16, 2013

(65) Prior Publication Data

US 2014/0324408 A1    Oct. 30, 2014

(30) Foreign Application Priority Data

Apr. 29, 2013    (DE) .................. 10 2013 104 320

(51) Int. Cl.
    *G06F 9/44*    (2006.01)
    *G06F 13/10*    (2006.01)
    (Continued)

(52) U.S. Cl.
    CPC ............. *G06F 9/455* (2013.01); *G06F 8/35* (2013.01); *G06F 15/7871* (2013.01); *G06F 17/5027* (2013.01); *G06F 17/5054* (2013.01)

(58) Field of Classification Search
    None
    See application file for complete search history.

(56) References Cited

U.S. PATENT DOCUMENTS

| 7,024,651 B1 * | 4/2006 | Camilleri | ......... H03K 19/17736 |
| | | | 716/117 |
| 7,086,014 B1 * | 8/2006 | Bartz | .................. G06F 17/5045 |
| | | | 345/594 |

(Continued)

OTHER PUBLICATIONS

Duelks, Ramona et al., "A Real-Time Test and Simulation Environment Based on Standard FPGA Hardware", 2009, Testing: Academic and Industrial Conference—Practice and Research Techniques, IEEE.*

(Continued)

*Primary Examiner* — Cedric D Johnson
(74) *Attorney, Agent, or Firm* — Muncy, Geissler, Olds & Lowe, P.C.

(57) ABSTRACT

A method for generating software for a hardware component of a measuring, control, or regulating system having a processor, an FPGA, and a plurality of I/O channels. The I/O channels are connected to the FPGA and the FPGA is connected to the processor via a communications interface. The method includes the steps of selecting a first subset of the I/O channels for operation by the FPGA, generating a first application for execution in the FPGA, selecting a second subset of the I/O channels for operation by the processor, and generating a second application for execution on the processor. The step of generating a first application comprises generating code for connecting the second subset of I/O channels to the communications interface. The invention relates in addition to a method for operating a hardware component.

13 Claims, 7 Drawing Sheets

(51) Int. Cl.
  *G06F 13/12*  (2006.01)
  *G06F 9/455*  (2006.01)
  *G06F 17/50*  (2006.01)
  *G06F 15/78*  (2006.01)

(56) References Cited

U.S. PATENT DOCUMENTS

| | | | |
|---|---|---|---|
| 7,568,172 B2 | 7/2009 | Breyer et al. | |
| 2001/0025231 A1 | 9/2001 | Kodosky et al. | |
| 2003/0038842 A1* | 2/2003 | Peck | G06F 11/263 |
| | | | 715/763 |
| 2003/0163298 A1 | 8/2003 | Odom et al. | |
| 2003/0195729 A1 | 10/2003 | Kodosky et al. | |
| 2003/0200076 A1 | 10/2003 | Kodosky et al. | |
| 2005/0177816 A1* | 8/2005 | Kudukoli | G06F 8/34 |
| | | | 717/105 |
| 2008/0270920 A1* | 10/2008 | Hudson | G06F 8/34 |
| | | | 715/763 |

OTHER PUBLICATIONS

European Search Report for European Application No. 14151561.9 dated Jul. 9, 2014 with English translation.
Duelks et al., "A real-time test and simulation environment based on standard FPGA hardware," IEEE Testing: Academic & Ind. Conf.—Prac & Research Tech., pp. 197-204 (Sep. 4, 2009).
"Auf zu schnelleren Zeiten," http://www.dspace.com/shared/data/pdf/in_2012/magazine_42_45_Schnelle_Zeiten_D.pdf, pp. 1-4 (Jun. 1, 2012) with English translation.
"Wenn sich Prozessor und FPGA ergänzen," http://www.dspace.com/shared/data/pdf/in_2011/503dSpace_Ek_car_2011-05_lowres.pdf, pp. 1-3 (May 1, 2011) with English translation.
Teich et al., "Optimization of Dynamic Hardware Reconfigurations," J. of Supercomp., vol. 19, No. 1, pp. 57-75 (May 1, 2001).
AT 6000 Series Configuration, http://www.zmitac.aei.polsl.pl/Electronics_Firm_Docs/ATMEL/Atmel/acrobat/doc0436.pdf, pp. 1-21 (Jan. 1, 1999).

* cited by examiner

FLEXIBLE ALLOCATION OF I/O CHANNELS OF A HARDWARE COMPONENT

This nonprovisional application claims priority under 35 U.S.C. §119(a) to German Patent Application No. DE 10 2013 104 320.8, which was filed in Germany on Apr. 29, 2013, and which is herein incorporated by reference.

BACKGROUND OF THE INVENTION

Field of the Invention

The present invention relates to a method for generating software for a hardware component of a measuring, control, or regulating system having a processor, an FPGA, and a plurality of I/O channels, whereby the I/O channels are connected to the FPGA and the FPGA is connected to the processor via a communications interface. Likewise, the invention relates to a computer program product with computer-implemented instructions, the product which after loading and execution in a suitable data processing device performs the steps of the above method, and a digital storage medium with electronically readable control signals, which can work together with a programmable data processing device, so that the above method is carried out in the data processing device. Further, the invention relates to a method for operating such a hardware component and a hardware component for executing the method.

Description of the Background Art

The real-time simulation of complex, dynamic models has high requirements because of the narrow time constraints even in modern computation nodes. For example, such models are used in automotive hardware-in-the-loop simulations (HIL), where fast control loops must be closed. This is the case, for instance, in the simulation of in-cylinder pressure sensors, which play an increasingly greater role in consumption or exhaust gas reduction. However, short cycle times and low latencies are indispensable also in controlled systems which have high dynamics, such as, for example, in electric motors. These can no longer be implemented practically with CPU-based simulations.

Field programmable gate arrays (FPGAs) can support hardware components during real-time simulation in that they take over the calculation of the dynamic parts of a model. Tough real-time requirements can also be easily met by the high flexibility and possibility of parallel processing of signals with the use of FPGAs. The FPGAs can be used in general as hardware accelerators for CPUs.

The described hardware components are used in two operating modes in the conventional art. In a first operating mode, a fixed functionality is loaded in the FPGA, as a result of which the FPGA is configured. I/O channels with a set functional scope are provided at the communications interface via this fixed functionality, so that the I/O channels can be used in an application in the processor. A user works in this first operating mode solely with a model-based generated processor application, e.g., with an RTI blockset. The application runs completely on the processor and accesses the I/O via the fixed FPGA functionality.

In a second operating mode, FPGA code generated model-based by the user is loaded into the FPGA, the code which uses the I/O channels in the FPGA. This refers, for example, to a control model in the FPGA or preprocessing of the I/O channels in the FPGA. The processor does not access the I/O channels in this operating mode. In this operating mode, the user works with a model-based generated FPGA application, e.g., with the RTI FPGA programming blockset. In addition, a processor application, which can communicate with the FPGA application, can be executed in the processor. However, the processor application cannot use the I/O channels with a set functional scope and a defined interface.

SUMMARY OF THE INVENTION

It is therefore an object of the present invention to provide a method that enables flexible use of the hardware component, whereby FPGA and processor can communicate with I/O channels during the execution and the available I/O channels of the hardware component can be freely allocated to the FPGA and processor.

According to an embodiment of the invention, a method is provided for generating software for a hardware component of a measuring, control, or regulating system having a processor, an FPGA, and a plurality of I/O channels, whereby the I/O channels are connected to the FPGA and the FPGA is connected to the processor via a communications interface, the method comprising the steps of selecting a first subset of I/O channels for operation by the FPGA, generating a first application for execution in the FPGA, selecting a second subset of I/O channels for operation by the processor, generating a second application for execution on the processor, whereby the step of generating a first application comprises the generation of code for connecting the second subset of I/O channels to the communications interface.

In an embodiment, two applications are generated, one in the processor and one in the FPGA, which depending on the use allocate the I/O channels as desired to the two applications. The first application in the FPGA, also called the FPGA application below, thus only accesses the I/O channels which it needs for performing its tasks. The other I/O channels are provided via the communications interface in the second application in the processor, also called the processor application below. This enables a combination of a classic model-based generation of control, measurement, or regulation models with model-based generated FPGA models, which based on the FPGA technology enable short cycle times in the sub-microsecond range for regulation models or very high-performance signal preprocessing for measurement applications in a hardware component.

In the method, the first and the second subset can each be selected as needed. Alternatively, also an implicit selection of the first or second subset can occur in that only the first or second subset is selected and the other subset forms the set of the rest of the I/O channels.

The selection of I/O channels for the first or second subset can occur in principle at any point in time. For example, initially both the first and also the second subset of I/O channels can be selected, and the generation of the first and second application occurs after this. The selection of I/O channels for the first or second subset can also occur before the actual generation of the corresponding first or second application, or a substep of the particular step for generating the first or second application. The sequence of the generation of the first and second application is arbitrary in principle. The I/O channels can be either analog or digital I/O channels.

In an embodiment of the invention, the step of generating code for connecting the second subset of I/O channels to the communications interface comprises the generation of code for executing signal processing between at least one of the I/O channels of the second subset and the communications interface. Accordingly, for example, preprocessing of input values received at an I/O channel can be performed by rapid processing in the FPGA, whereas other evaluation steps are performed flexibly on the processor.

In an embodiment of the invention, the method comprises generating an application model, whereby the step of generating the first application comprises the model-based automatic generation of code. The modeling enables a simple code generation, whereby short development times are possible. Function blocks can be used to generate a desired functionality in the FPGA model-based in Matlab or Simulink. Further, the necessary I/O channels are preferably used in the application model and connected to a previously generated functionality.

In an embodiment of the invention, the step of generating code for connecting the second subset of I/O channels to the communications interface comprises the automatic generation of code for connecting I/O channels that are part of the second subset of I/O channels. Thus, a user can disregard I/O channels of the second subset during modeling of the FPGA application, as a result of which these are automatically connected to the communications interface, for example, according to a preset.

In an embodiment of the invention, the step of generating code for connecting the second subset of I/O channels to the communications interface comprises providing pre-synthesized code for connecting I/O channels that are part of the second subset of I/O channels. The pre-synthesized code, moreover, makes it possible to reduce the time for generating the first application. The pre-synthesized code is part of the FPGA application, without it needing to be translated. The pre-synthesized code can be easily merged with other code elements, which is called fitting or place & route by different FPGA providers. Next, the code can be loaded in its entirety in the FPGA. The pre-synthesized code is preferably obtained from an available library.

In an embodiment of the invention, the step of generating the first application comprises providing identification information of the first subset. The identification information of the first subset can be used to limit the selection of I/O channels to the still available channels during the generation of the second application, which makes it possible to generate the second application simply and reliably. A modeling environment for the model-based FPGA application generation can provide all I/O channels of the hardware component for the application model. After the modeling of the FPGA application, identification information for I/O channels not needed in the FPGA application is provided for the second application, so that these free I/O channels not needed in the FPGA application can be used selectively.

In an embodiment of the invention, the step of generating the first application comprises receiving the identification information of the second subset. The identification information of the second subset can be used to limit the selection of I/O channels to the still available channels during the generation of the first application, which makes it possible to generate the first application simply and reliably. Identification information for the I/O channels not needed in the second application can be provided for the first application so that these free I/O channels not needed in the processor application can be used selectively.

In an embodiment of the invention, the method comprises the step of generating an application model, whereby the step of generating the second application comprises the model-based automatic generation of code. The modeling enables a simple code generation, whereby short development times are possible. Function blocks can be used to generate a desired functionality in the processor model-based in Matlab or Simulink. Further, the necessary I/O channels are preferably used in the application model and connected to a previously generated functionality.

The application model can be a uniform model for generating the first and second application. Alternatively, however, a model for generating the first application and another model for generating the second application can also be used.

In an embodiment of the invention, the step of generating the second application comprises providing the identification information of the second subset. The identification information of the second subset can be used to limit the selection of I/O channels to the still available channels during the generation of the first application, which makes it possible to generate the first application simply and reliably. A modeling environment for the model-based processor application generation can provide all I/O channels of the hardware component for the application model. After the modeling of the processor application, identification information for the I/O channels not needed in the processor application are provided for the first application so that these free I/O channels not needed in the processor application can be used selectively.

In an embodiment of the invention, the step of generating the second application comprises receiving the identification information of the first subset. The identification information of the first subset can be used to limit the selection of I/O channels to the still available channels during the generation of the second application, which makes it possible to generate the second application simply and reliably. Identification information for the I/O channels not needed in the first application can be provided for the second application, so that these free I/O channels not needed in the FPGA application can be used selectively.

Furthermore, the invention relates to a method for operating a hardware component of a measuring, control, or regulating system having a processor, an FPGA, and a plurality of I/O channels, whereby the I/O channels are connected to the FPGA and the FPGA is connected to the processor via a communications interface, the method comprising the loading of software generated according to the above method, and the execution of the software, whereby the loading of the software comprises loading of the first application into the FPGA and the loading of the second application into the processor. Accordingly, two applications, one on the processor and one in the FPGA, can be executed in the hardware component, which depending on the use allocate the I/O channels arbitrarily to the two applications. This enables the provision of a combination of classic control, measurement, or regulation models with model-based generated FPGA models, which based on the FPGA technology enable short cycle times in the sub-microsecond range for regulation models or very high-performance signal preprocessing for measurement applications in a hardware component.

In an embodiment of the invention, the method comprises the step of partial reconfiguration of the FPGA. In particular, when the applications are modified, proceeding from the code present in the FPGA only one part can be replaced, whereby the FPGA can be used rapidly with the modified code. As a result, the time from an application model to the generation of the first application is also shortened, because accordingly only parts of the FPGA code need to be implemented. In principle, the reconfiguration can affect any parts of the FPGA code, therefore also pre-synthesized code. Accordingly, individual components can be written pre-implemented in the FPGA or remain there after prior use.

Further, the invention relates to a hardware component of a measuring, control, or regulating system having a processor, an FPGA, and a plurality of I/O channels, whereby the I/O channels are connected to the FPGA and the FPGA is connected to the processor via a communications interface, whereby the hardware component is designed to carry out the above method.

Likewise, the invention relates to a computer program product with computer-implemented instructions, which after loading and execution in a suitable data processing device carries out the above method.

The invention relates further to a digital storage medium with electronically readable control signals, which can work together with a programmable data processing device so that the above method is carried out in the data processing device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
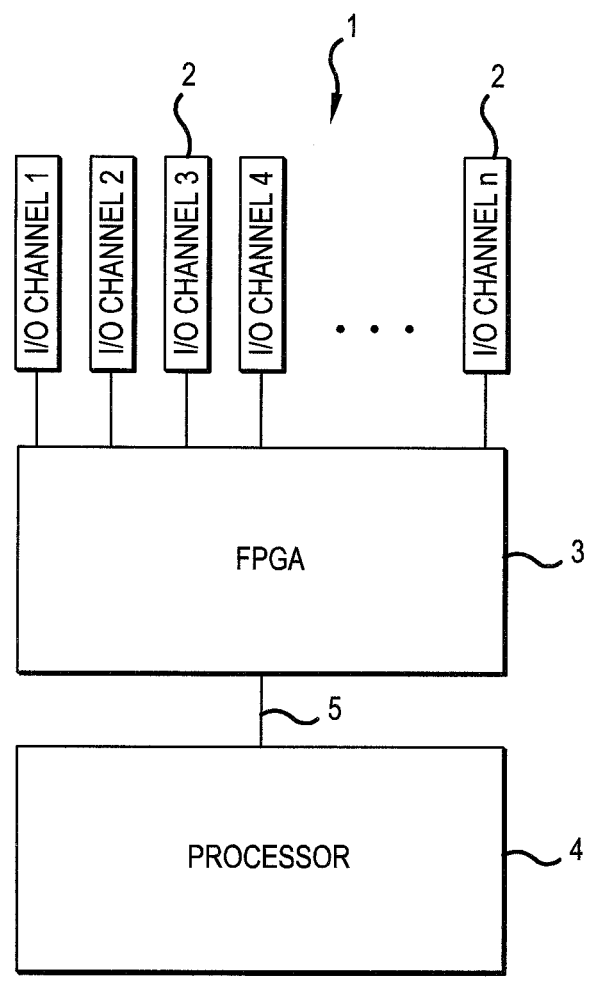
FIG. 1 is a schematic illustration of a hardware component according to an embodiment of the invention.

FIG. 1 shows a hardware component 1 of the measuring, control, or regulating system according to a first embodiment. The hardware component 1 here is by way of example a device for rapid control prototyping (RCP) and comprises a plurality of I/O channels 2, an FPGA 3, and a processor 4. I/O channels 2 are connected to FPGA 3 and FPGA 3 is connected to processor 4 via a communications interface 5. In this exemplary embodiment, hardware component 1 has as I/O channels 2 overall 24 ADCs, 16 DACs, and 48×DIO, which are shown only partially in FIG. 1.

Figure 2:
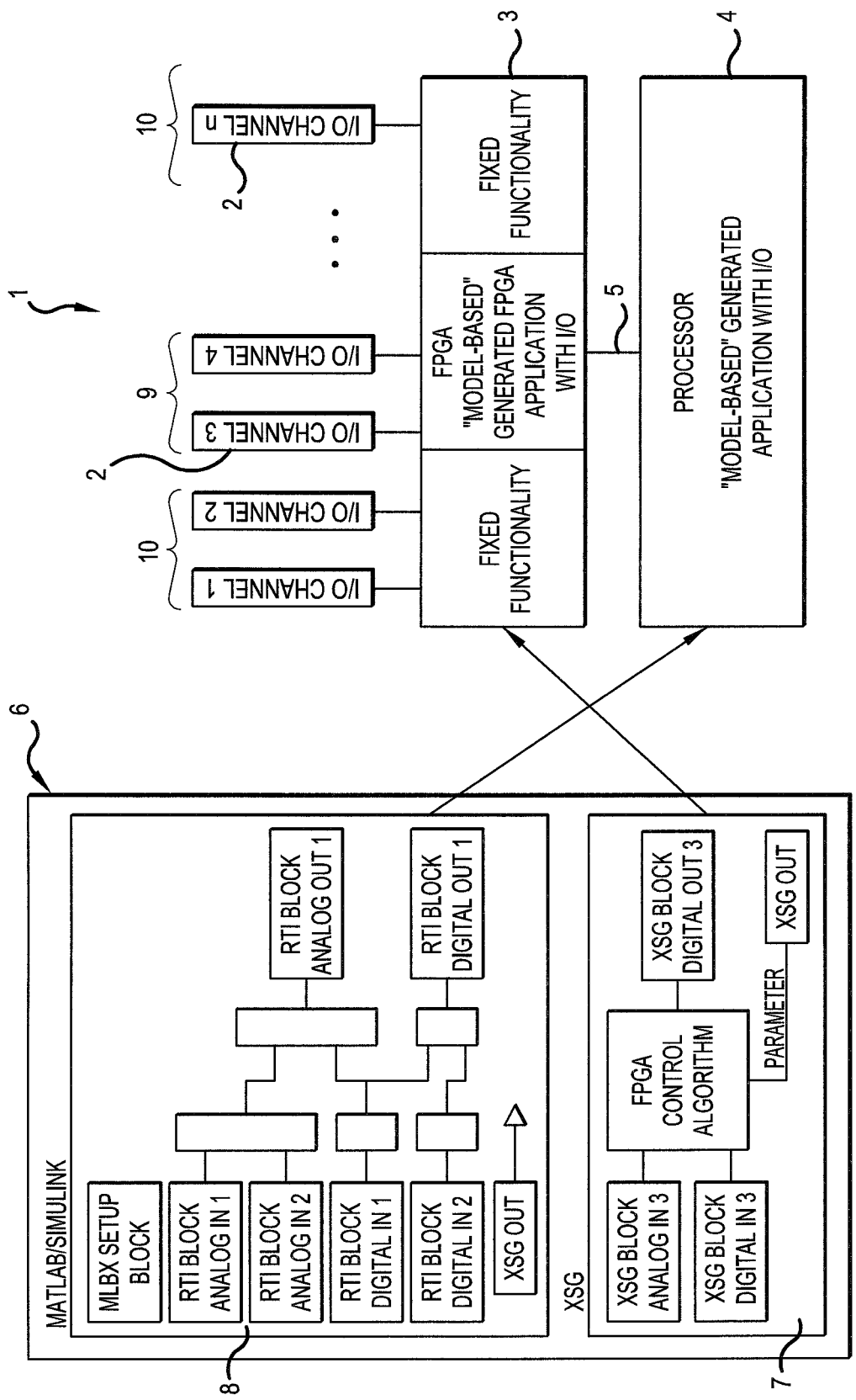
FIG. 2 is a schematic illustration of the hardware component according to FIG. 1 together with a schematic illustration of a data processing device for carrying out a method according to an embodiment of the invention.

FIG. 2 shows in addition to hardware component 1 a data processing device 6, which is a powerful computer. As first software block 7 an FPGA programming blockset with a Simulink blockset for programming FPGA 3 and Xilinx Tools (ISE, XSG) for generating a first application for execution in FPGA 3 and as second software block 8 an RTI blockset or a Simulink blockset for generating a second application for execution on processor 4 are executed in data processing device 6.

Figure 3:
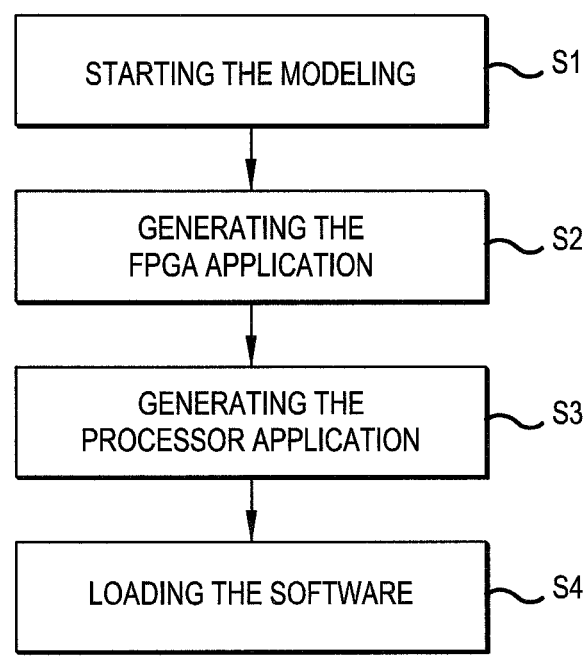
FIG. 3 is a flowchart of a method according to an embodiment of the invention.

FIG. 3 illustrates in general a method for generating software for hardware component 1 and for operating hardware component 1. The method begins in step S1 in that a user starts the modeling of his application, i.e., software for hardware component 1.

Figure 4:
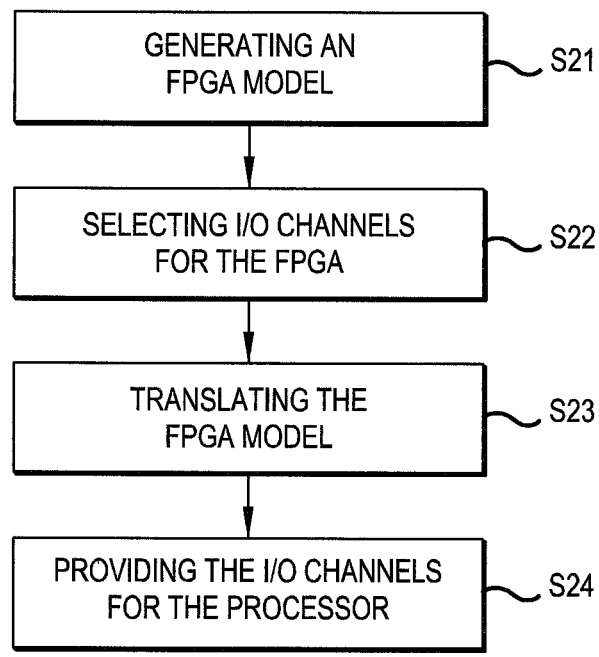
FIG. 4 is a detailed flowchart of step S2 according to FIG. 3.

In step S2, a first application for execution in FPGA 3 is generated. To this end, first, as shown in the detail in FIG. 4, an FPGA model is generated in step S21. XSG function blocks are used to generate the desired functionality in FPGA 3 model-based in Matlab/Simulink. For this purpose, the user is provided all I/O channels 2 of hardware component 1 by the FPGA programming blockset.

In step S22, the user makes a selection of a first subset 9 of I/O channels 2 for operation by FPGA 3, i.e., a selection of I/O channels 2, associated with the first application. For this purpose, the user uses the necessary I/O channels 2 from the FPGA programming block set in his FPGA model and then connects them with his previously generated functionality. For example, here 8 ADCs and 8 DACs are used in the FPGA model, which form first subset 9, of which only a part is shown in FIG. 2. In this exemplary embodiment, an automatic selection of a second subset 10 of I/O channels 2 occurs for operation by processor 4 as the set of I/O channels 2 that do not belong to first subset 9.

Figure 5:
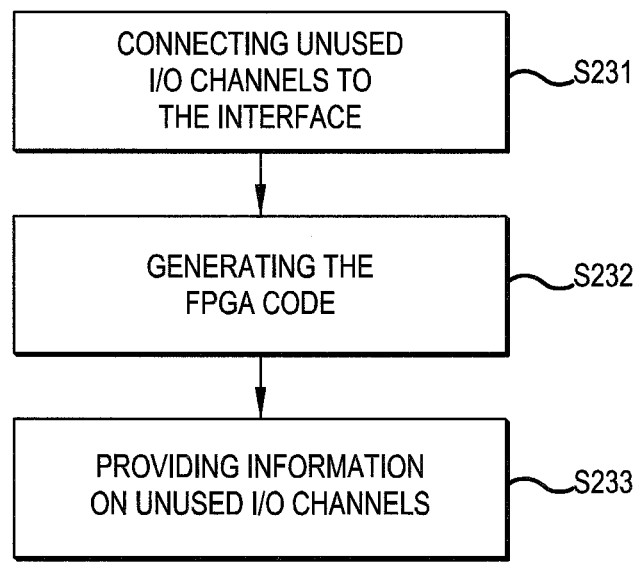
FIG. 5 is a detailed flowchart of step S23 according to FIG. 4.

In step S23, the FPGA model is translated. For this purpose, as is shown in detail in FIG. 5, in step S231 I/O channels 2 that are not used by the FPGA model, in this example 16 ADCs, 8 DACs, and 24 DIOs, are automatically assigned a standard functionality by the FPGA programming blockset, so that the I/O channels 2 can be used later by the RTI blockset for generating the second application, as is explained further below.

The FPGA code is generated in step S232. This comprises the model-based automatic generation of the code for the FPGA model generated by the user and the generation of code for connecting second subset 10 of I/O channels 2 to communications interface 5. The code for connecting second subset 10 of I/O channels 2 to communications interface 5 includes pre-synthesized code for connecting I/O channels 2 of second subset 10 of I/O channels 2, which are added from a library to the additional synthesized code. The connecting of different components of the entire code is called, for example, "fitting" in FPGAs from Altera and "MAP+Place & Route" in FPGAs from Xilinx.

Identification information of first subset 9 is provided in step S233. The identification information includes information on I/O channels 2 where the standard functionality is available.

Figure 6:
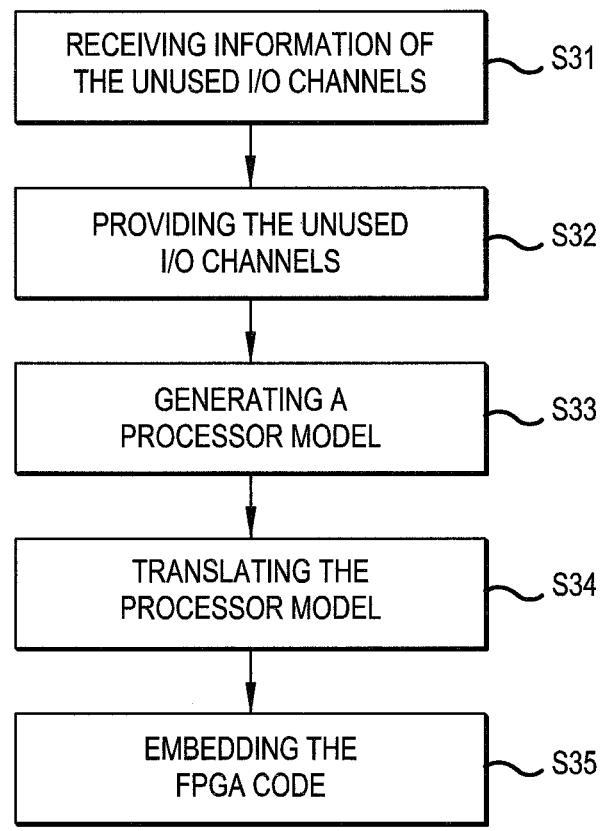
FIG. 6 is a detailed flowchart of step S3 according to FIG. 3.

This is followed in step S3 by the generation of the second application for execution in processor 4. For this purpose, as is shown in detail in FIG. 6, in step S31 the RTI blockset receives in detail from the FPGA blockset the identification information on which I/O channels 2 with the standard functionality are available. These are provided for use in step S32.

The application model is generated in step S33. This occurs in the RTI blockset with I/O channels 2 provided for use in step S32. The model of the second application is generated in Matlab/Simulink.

In step S34, the completely modeled model of the second application is translated as usual; i.e., a build is performed whereby the second application is generated automatically based on the model. For this purpose, the identification information of first subset 9 is received.

In step S35 the previously generated first application, i.e., the FPGA application, is embedded in the second application, i.e., the processor application.

Figure 7:
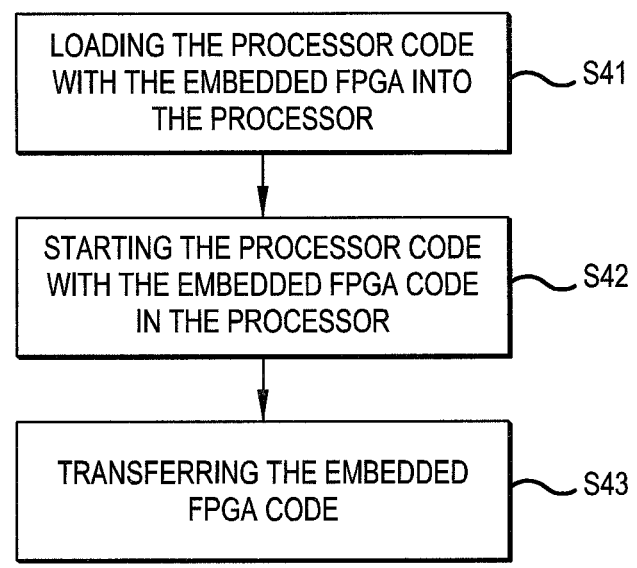
FIG. 7 is a detailed flowchart of step S4 according to FIG. 3.

In step 4, the generated software, i.e., the first and the second application, is loaded in the hardware component. For this purpose, first, as shown in detail in FIG. 7, in step S41 the second application with the embedded first application is loaded into processor 4, whereby the second application is stored in a memory assigned to processor 4.

In step S42 the second application with the embedded first application is started from the memory for execution on processor 4.

The first application is transferred to the FPGA in step S43 by the execution of the second application with the embedded first application.

Next, hardware component 1 can be operated according to the loaded first and second application.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for generating software for a hardware component of a measuring, control, or regulating system having a processor, an FPGA (Field Programmable Gate Array), and a plurality of I/O (Input/Output) channels, the hardware component being connectable to a computer system, the I/O channels being connectable to the FPGA, and the FPGA being connectable to the processor via a communications interface, the method comprising:
    selecting a first subset of the I/O channels for operation by the FPGA;
    generating a first application program to be executed by the FPGA;
    selecting a second subset of the I/O channels for operation by the processor based on the selected first subset of the I/O channels;
    generating a second application program to be executed by the processor;
    generating an application model for the hardware component,
    embedding the first application program in the second application program,
    storing the second application program with the embedded first application program in a memory assigned to the processor for execution by the processor, and
    executing the first application program and the second application program,
    wherein the step of generating the first application program comprises model-based automatic generation of code based on the application model for the hardware component,
    wherein the step of generating a first application program comprises the generation of code for connecting the second subset of the I/O channels to the communications interface,
    wherein the step of generating code for connecting the second subset of the I/O channels to the communications interface comprises the automatic generation of code for connecting I/O channels that are part of the second subset of I/O channels, and
    based on the executed first application program and second application program, connecting the hardware component of the computer system, wherein the hardware component includes the I/O channels, the FPGA, and the processor, with the I/O channels connecting to the FPGA, and the FPGA connecting to the processor, via the communication interface.

2. The method according to claim 1, wherein the step of generating code for connecting the second subset of the I/O channels to the communications interface comprises the generation of code for executing a signal processing between at least one of the I/O channels of the second subset and the communications interface.

3. The method according to claim 1, wherein the step of generating the first application program comprises providing identification information of I/O channels of the first subset.

4. The method according to claim 1, wherein the step of generating the first application program comprises receiving identification information of the I/O channels of the second subset.

5. The method according to claim 1, further comprising generating an application model, wherein the step of generating the second application program comprises model-based automatic generation of code.

6. The method according to claim 5, wherein the step of generating the second application program comprises providing identification information of the I/O channels of the second subset.

7. The method according to claim 5, wherein the step of generating the second application program comprises receiving identification information of the I/O channels of the first subset.

8. A method for operating a hardware component of a measuring, control, or regulating system having a processor, an FPGA, and a plurality of I/O channels, wherein the I/O channels are connectable to the FPGA and the FPGA is connectable to the processor via a communications interface, the method comprising:
    loading software that is generated according to the method according to claim 1; and
    executing the software,
    wherein the loading of the software comprises loading of the first application program into the FPGA and loading of the second application program into the processor.

9. The method according to claim 8, further comprising partial reconfiguration of the FPGA.

10. A hardware component of a measuring, control, or regulating system having a processor, an FPGA, and a plurality of I/O channels, wherein the I/O channels are connectable to the FPGA and the FPGA is connectable to the processor via a communications interface, and wherein the hardware component is configured to perform the method according to claim 8.

11. The method according to claim 1, wherein the method is implemented via a computer program product having computer implemented instructions, which is loaded and executed in a data processing device.

12. A non-transitory digital storage medium having electronically readable control signals, which operates together with a programmable data processing device so that the method according to claim 1 is performed in a data processing device.

13. A method for generating software for a hardware component of a measuring, control, or regulating system having a processor, an FPGA (Field Programmable Gate Array), and a plurality of I/O (Input/Output) channels, the hardware component being connectable to a computer system, the I/O channels being connectable to the FPGA, and the FPGA being connectable to the processor via a communications interface, the method comprising:
- selecting a first subset of the I/O channels for operation by the FPGA;
- generating a first application program to be executed by the FPGA so as to cause the FPGA to perform an FPGA function only through the first subset of the I/O channels;
- selecting a second subset of the I/O channels for operation by the processor; and
- generating a second application program to be executed by the processor so as to cause the processor to perform a processor function only through the second subset of the I/O channels,
- storing the second application program with the embedded first application program in a storage for execution on the processor, and
- executing the first application program and the second application program,
- wherein the step of generating a first application program comprises the generation of code for connecting the second subset of the I/O channels to the communications interface, thereby causing the processor to perform the processor function through the second subset of the I/O channels via the communication interface,
- wherein the step of generating a second application program comprises embedding the first application program in the second application program, and
- based on the executed first application program and second application program, connecting the hardware component of the computer system, wherein the hardware component includes the I/O channels, the FPGA, and the processor, with the I/O channels connecting to the FPGA, and the FPGA connecting to the processor, via the communication interface.

* * * * *